United States Patent

[11] 3,622,889

[72] Inventor Italo Ridolfi
River Grove, Ill.
[21] Appl. No. 854,100
[22] Filed Aug. 29, 1969
[45] Patented Nov. 23, 1971
[73] Assignee Standard Kollsman Industries, Inc.
Melrose Park, Ill.

[54] BANDPASS RESPONSE DISPLAY
9 Claims, 3 Drawing Figs.

[52] U.S. Cl. .......... 325/363, 178/DIG. 4, 324/57 Q
[51] Int. Cl. .......... H04b 1/00
[50] Field of Search .......... 325/363, 462; 178/6 T, 6 TT, DIG. 4, 5.4 TE; 324/57, 57 Q; 315/26; 334/11, 15, 16

[56] References Cited

UNITED STATES PATENTS

| | | | |
|---|---|---|---|
| 2,252,058 | 8/1941 | Bond .......... | 324/57 Q |
| 3,441,843 | 4/1969 | Wainwright .......... | 324/57 |

*Primary Examiner*—Robert L. Griffin
*Assistant Examiner*—R. S. Bell
*Attorneys*—E. Manning Giles, J. Patrick Cagney, Peter S. Lucyshyn and Richard G. Kinney

ABSTRACT: A method of testing and aligning a voltage controlled tuner provides a simultaneous display of the low and high-channel frequency response to facilitate setting of the adjustable tuning reactances. A function generator provides different tuning voltage levels in synchronism with a variable frequency signal from a sweep generator to create the tuner output signals representative of the low and high-channel responses.

INVENTOR
Italo Ridolfi
BY J. Patrick Cagney
ATTORNEY

BANDPASS RESPONSE DISPLAY

BACKGROUND OF THE INVENTION

The process normally used to align a multicircuit tuner is unduly time consuming and requires a complex sequence of equipment settings.

The alignment procedure is described herein in relation to a voltage variable capacitor type of tuner such as is shown in Wittig U.S. Pat. No. 3,354,397 or Gossard, et al. U.S. Pat. application Ser. No. 671,011 filed Sept. 27, 1967 now Pat. No. 3,534,975. Thus, the following steps are utilized in the alignment of a voltage variable capacitor type of tuner with trimmer capacitors connected in shunt with the voltage variable capacitors.

1. Adjust sweep frequency generator to place the center frequency at the center of the channel at the high-frequency high-frequency end of the tuning range.

2. Adjust the tuning voltage applied to the voltage variable capacitors to the nominal voltage for the high-frequency channel.

3. Adjust all trimmer capacitors to produce a reasonably symmetrical curve centered about the center frequency and provide maximum output as noted on the cathode ray oscilloscope display tube.

4. Adjust the sweep frequency generator to place the center frequency at the center of the channel at the low-frequency low-frequency end of the tuning range.

5. Adjust the tuning voltage applied to the voltage variable capacitors to the nominal voltage for the low-frequency channel.

6. Adjust the inductors associated with the resonant circuits to produce a reasonably symmetrical curve about the center frequency and provide maximum output as noted on the cathode ray oscilloscope display tube.

7. Repeat steps 1 thru 6 until no further change is noted or until the band-pass curve and amplitude are within limits at both ends of the tuning range.

SUMMARY OF THE INVENTION

The present invention provides a tuner testing and alignment method that is applicable to any voltage variable type of tuner that is tunable to each channel in a band of channels, such a tuner having adjustable tuning reactances for setting the low and high channel alignments of a band, the method comprising simultaneously displaying the low channel and high channel frequency response characteristics and setting the adjustable tuning reactances while monitoring the response characteristics until desired tuning is achieved.

More particularly, the method comprises generating a sweep signal at a predetermined repetition rate, generating a variable frequency output signal to sweep the tuner band in synchronism with the sweep signal, generating a tuning voltage signal in synchronism with the sweep signal to provide a voltage of a level to tune the low channel when the output signal is sweeping the low channel frequency range and to provide a voltage of a level to tune the high channel when the output signal is sweeping the high channel frequency range, concurrently applying the variable frequency output signal as signal input to the tuner and the tuning voltage as control input to the tuner to produce a tuner output signal that repeatedly generates the frequency response characteristics for the low and high channels and applying the sweep signal and the tuner output signal to control coordinate beam deflection of a cathode ray oscilloscope.

As a further feature for folding the region of the sweep voltage axis intermediate of the low and high channels, the method provides for generating the sweep signal with an intermediate hump region timed to occur during the time that the variable frequency output signal is sweeping frequencies intermediate of the low and high channels.

In accordance with the invention, an improved function generator is provided for generating the tuning voltage signal in synchronism with the sweep signal to provide the required voltage levels at the appropriate timing. The function generator includes a clipper branch circuit supplied with an AC signal to provide a clipped half wave signal for controlling the tuning voltages. The function generator includes another clipper branch circuit supplied from the same AC signal to provide a clipped half wave signal additive to the sweep voltage to provide a humped region of the sweep signal that acts to fold the sweep voltage axis at the region intermediate of the low and high channels.

Other features and advantages of the invention will be apparent from the following description and claims and are illustrated in the accompanying drawings which show structure embodying preferred features of the present invention and the principles thereof, and what is now considered to be the best mode in which to apply these principles.

BRIEF DESCRIPTION OF THE DRAWINGS

In the accompanying drawings forming a part of the specification, and in which like numerals are employed to designate like parts throughout the same.

DESCRIPTION OF PREFERRED EMBODIMENT

Figure 1:
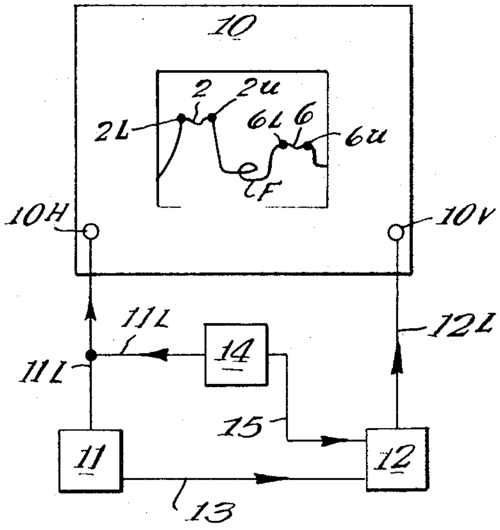
FIG. 1 is a schematic diagram in block form showing a configuration of test apparatus utilized in the practice of the present invention.

Referring now to the drawings, a tuner testing arrangement is shown in FIG. 1 as including a CRO 10 having its horizontal input 10H connected to a sweep voltage from a sweep frequency generator 11 by a line 11L and having its vertical input 10V connected to the RF or IF output from a voltage controlled television tuner 12 by a line 12L.

For purposes of illustrative disclosure, the invention is described in relation to the testing and alignment of a varactor type VHF television tuner and in particular to the testing and alignment of its low band which is comprised of channels 2 thru 6.

In accordance with this invention the screen of the CRO simultaneously displays a response curve 2 representative of the low end channel and a response curve 6 representative of the high end channel of the selected tuner band.

The testing and alignment operation is facilitated by such a simultaneous display as this permits setting of the trimmer capacitors at the high end channel and the inductances at the low-end channel without manually setting the sweep generator center frequencies and the applied tuning voltages each time an adjustment is to be made.

Figure 2:
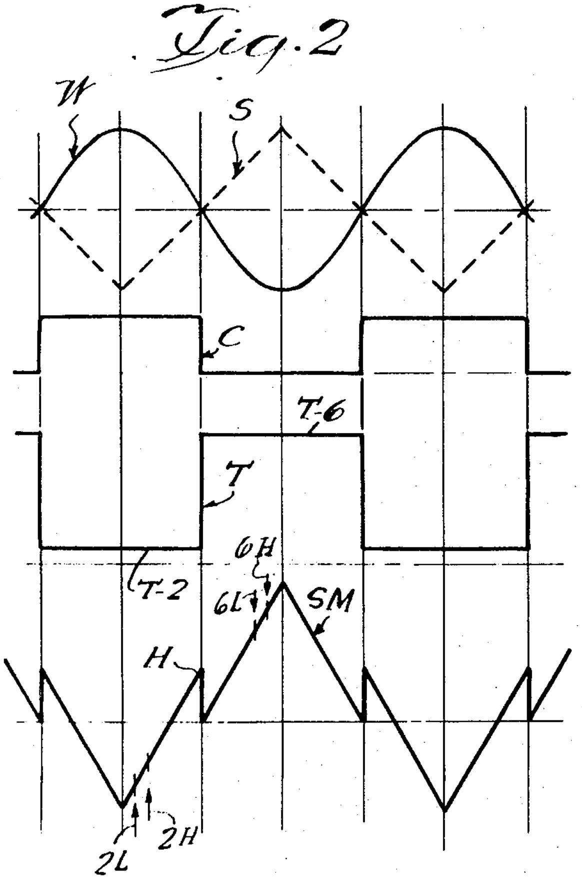
FIG. 2 is a waveform diagram to facilitate disclosure of the invention.

With reference to FIGS. 1 & 2, it may be noted that the desired simultaneous display is achieved where the sweep generator 11 is connected by a line 13 to apply a variable frequency signal to the tuner 12 in synchronism with the sweep voltage S applied to the horizontal input 10H and a function generator 14 is connected by a line 15 to apply a tuning voltage T to the tuner.

As the variable frequency signal applied as signal input to the tuner over line 13 sweeps between the lower and upper frequency limits 2L, 2U of channel 2, the tuning voltage applied over line 15 is at the required channel 2 voltage level as indicated at T–2. Similarly, as the variable frequency signal sweeps between lower and upper frequency limits 6L, 6U of channel 6, the tuning voltage applied over line 15 is at the channel 6 voltage level.

Figure 3:
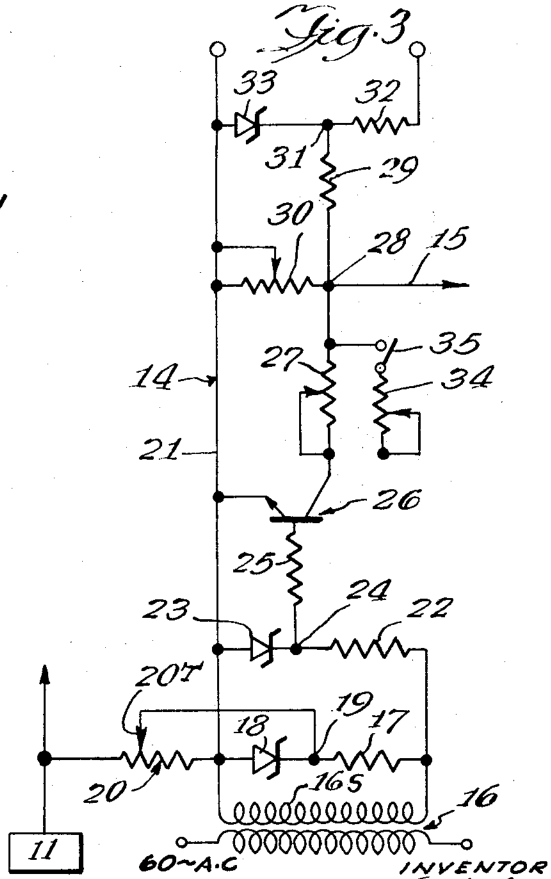
FIG. 3 is a circuit diagram of the function generator.

In the preferred embodiment that is illustrated herein for purposes of disclosure, the function generator 14 is of the form shown in FIG. 3 to provide the tuning voltage T and to provide a clipped half wave voltage signal C which is applied to the line 11L to modify the sweep voltage S to that shown at SM in FIG. 2. The hump region H of the sweep signal SM causes the horizontal axis of the trace on the CRO to fold or overlap as shown at F in FIG. 1.

The function generator circuit 14 includes a supply transformer 16 connected to a 60 cycle AC line and having its secondary 16S connected across parallel clipper circuits. The first clipper circuit is comprised of a series connected resistor 17 and a 12-volt zener diode 18 having an intermediate junction 19 connected to the tap 20T of a potentiometer 20 which is bridged between the line 11L and the ground line 21 of the function generator circuit. The second clipper circuit is comprised of a series connected resistor 22 and a 12-volt zener diode 23 having an intermediate junction 24 connected through a bias resistor 25 to the base of a PNP transistor 26 which may be of type No. 2N3568.

The transistor has its emitter grounded and has its collector connected through a variable resistor 27 to the junction point 28 of a voltage divider network. The voltage divider network includes resistors 29, 30. The resistor is connected to an intermediate junction 31 in a voltage regulator branch that is comprised of a resistor 32 and a 24-volt zener diode 33. A DC voltage, nominally of 30 volts, is applied to the input terminals of the voltage regulator branch.

The tuning voltage developed at junction 28 is applied to the line 15 that connects to the voltage variable capacitance of the tuner. When the transistor 26 is "ON" the low-level tuning voltage T–2 for channel 2 is available at the junction 28 by virtue of the voltage division determined by resistor 29 in series with the parallel combination of resistor 30 and the load circuit of the transistor. When the transistor 26 is "OFF" the high level tuning voltage T–6 for channel 6 is available at the junction 28 by virtue of the voltage division determined by resistor 29 in series with resistor 30.

With reference to FIG. 2 when the 60 cycle AC wave W is applied across the clipper circuits, a clipped half wave output C is developed at each of the junctions 19, 24. The junction 24 is connected to control the bias at the base of the transistor to switch the transistor ON or OFF and develop the tuning voltage waveform T characterized by the channel 2 voltage levels T–2 and the channel 6 voltage levels T–6 occurring in timed relation to the AC wave. The junction 19 is connected to the potentiometer tap 20T to apply a reduced amplitude square wave output to the line in opposite polarity to the sweep voltage S to produce the resultant modified waveform SM having humped regions H for folding the horizontal axis of the CRO. This enables the horizontal scale to be expended at the response regions for channels 2 and 6 which are the only regions of interest in the particular embodiment disclosed herein.

It should be noted where the response curves for the two regions of interest are displayed simultaneously, the final alignment of the tuner is quickly accomplished by setting the adjustment of the high end tuning reactances of the tuner 12 and setting the adjustment of the low end tuning reactances of the tuner while monitoring the response characteristics shown on the CRO.

In order to provide alignment of the high VHF band comprised of channels 7 to 13, a variable resistor 34 is controlled through a switch 35 to be connected in parallel with resistor 27. In this mode, the sweep generator is set to provide a variable frequency signal over line 13 that sweeps the high VHF band in timed relation with the tuning voltage applied over line 15 such that the tuning voltage level for channel 7 is applied while the channel 7 frequency range is being swept and the tuning voltage level for channel 13 is applied while the channel 13 frequency range is being swept. The settings of the adjustable reactances are then made while monitoring the response curves that are presented on the CRO in the same fashion as previously described.

The invention is also applicable to the alignment of a UHF tuner or to any other wide band tuner as will now be apparent to those skilled in this art.

What is claimed is:

1. In apparatus for displaying the frequency response characteristics of a voltage variable tuner that is tunable to each of a plurality of channels in a predetermined band of frequencies, said apparatus including a sweep frequency generator having a variable frequency output connected as signal input to the tuner and having a sweep voltage output synchronized with said variable frequency output and a cathode ray oscilloscope having a first coordinate deflection system connected to receive said sweep voltage output and a second coordinate deflection system connected to receive frequency-responsive output from said tuner, the improvement comprising the combination with said apparatus of a function generator having means operating in synchronism with the sweep frequency generator for applying said tuner, during the time that the variable frequency output is sweeping the frequency range of one of said channels, a tuning voltage of a level to tune said tuner to said one channel and for applying to said tuner, during the time that the variable frequency output is sweeping the frequency range of a different one of said channels, a tuning voltage of a level to tune said tuner to said different channel.

2. In apparatus in accordance with claim 1 and wherein said function generator includes a clipper branch circuit supplied with an AC signal in synchronism with the sweep frequency generator to provide a clipped half wave signal additive to the sweep voltage output to fold the region of the sweep voltage axis on the cathode ray oscilloscope that is intermediate said one channel and said different channel.

3. In apparatus in accordance with claim 1 and wherein said function generator includes a clipper branch circuit supplied with an AC signal in synchronism with the sweep frequency generator to provide a clipped half wave bias signal, a transistor responsive to said bias signal to switch between ON and OFF conditions, and a voltage divider connected in the load circuit of said transistor and having an intermediate juncture to provide one level of tuning voltage when said transistor is ON and a different level of tuning voltage when said transistor is OFF.

4. In apparatus in accordance with claim 3 and wherein said function generator includes another clipper branch circuit supplied with the AC signal to provide a clipped half wave signal additive to the sweep voltage output to fold the region of the sweep voltage axis on the cathode ray oscilloscope that is intermediate said one channel and said different channel.

5. The method of testing and aligning a wide band voltage variable tuner circuit that is tunable to each channel in a band of channels, said tuner circuit having first adjustable tuning reactances for setting the alignment of the tuner circuit at the lowest channel frequencies covered by said band and second adjustable tuning reactances for setting the alignment of the tuner circuit at the highest channel frequencies covered by said band, said method comprising simultaneously displaying the frequency response characteristics of said tuner circuit both for the lowest channel frequencies and for the highest channel frequencies in jointly viewable relation on CRO means by generating sweep signals at a predetermined repetition rate, generating successive pairs of output signals from said tuner circuit, said pairs of output signals alternating between an output signal representative of the response characteristics of said tuner circuit at said lowest channel frequencies and an output signal representative of the response characteristics of said tuner circuit at said highest channel frequencies and applying the sweep signals and the successive pairs of output signals to control coordinate beam deflection of the CRO means; and setting the first and second adjustable tuning reactances while monitoring the simultaneously displayed response characteristics until desired tuning is achieved.

6. The method of claim 5 and wherein the step of generating successive pairs of output signals comprises generating variable frequency output signals that sweep said band in synchronism with said sweep signals, generating tubing voltage signals in synchronism with said sweep signals to provide, during each time that one of said variable frequency output signals is sweeping the lowest channel frequencies, a tuning voltage of a level to tune said tuner circuit to said lowest channel frequencies and to provide, during each time that one of said variable frequency output signals is sweeping the highest channel frequencies, a tuning voltage of a level to tune said tuner circuit to said highest channel frequencies, and concurrently applying the variable frequency output signals as signal input to the tuber circuit and said tuning voltage signals as control input to the tuner circuit to produce said successive pairs of output signals.

7. The method of claim 6 and including generating each of the sweep signals with an intermediate hump region occurring during the time that the corresponding variable frequency output signal is sweeping frequencies intermediate of said lowest channel frequencies and said highest channel frequencies.

8. In a method for testing the frequency response characteristics of a voltage variable tuner at two different channels in a predetermined frequency band to which the tuner is tunable, said method comprising generating sweep signals at a predetermined repetition rate, generating variable frequency output signals that sweep said band in synchronism with said sweep signals, generating tuning voltage signals in synchronism with said sweep signals to provide, during the time that the variable frequency output signal is sweeping one channel frequency range, a tuning voltage of a level to tune said tuner to said one channel and to provide, during the time that the variable frequency output signal is sweeping the other channel frequency range, a tuning voltage of a level to tune said tuner to said other channel, concurrently applying the variable frequency output signals as signal input to the tuner and the tuning voltage signals as control input to the tuner to produce a tuner output signal which repeatedly generates the frequency response characteristics of said channels, and applying the sweep signals and the tuner output signals to control coordinate beam deflection of a cathode ray oscilloscope and provide a display that simultaneously presents the response characteristics of said tuner at said two different channels.

9. In a method in accordance with claim 8 and wherein each of said sweep signals is generated with an intermediate hump region occurring during the time that the corresponding variable frequency output signal is sweeping frequencies intermediate of the frequencies of said two different channels.

* * * * *

UNITED STATES PATENT OFFICE

CERTIFICATE OF CORRECTION

Patent No. 3,622,889 Dated November 23, 1971

Inventor(s) Italo Ridolfi

It is certified that error appears in the above-identified patent and that said Letters Patent are hereby corrected as shown below:

Column 1, line 16: delete "high-frequency"

Column 1, line 26: delete "low-frequency"

Column 1, lines 9-10: delete "Pat. No. 3,534,975" and add--abandoned--

Column 5, line 6: "tuber" should read--tuner--

Signed and sealed this 2nd day of May 1972.

(SEAL)
Attest:

EDWARD M.FLETCHER,JR.
Attesting Officer

ROBERT GOTTSCHALK
Commissioner of Patents

RM PO-1050 (10-69)

USCOMM-DC 60376-P69
☆ U.S. GOVERNMENT PRINTING OFFICE : 1969 0—366-334